United States Patent [19]

Schwalke

[11] Patent Number: 5,700,712
[45] Date of Patent: Dec. 23, 1997

[54] METHOD FOR MANUFACTURING AN INSULATING TRENCH IN AN SOI SUBSTRATE FOR SMARTPOWER TECHNOLOGIES

[75] Inventor: Udo Schwalke, Heldenstein, Germany

[73] Assignee: Siemens Aktiengesellschaft, Munich, Germany

[21] Appl. No.: 552,976

[22] Filed: Nov. 3, 1995

Related U.S. Application Data

[63] Continuation of Ser. No. 264,141, Jun. 21, 1994, abandoned.

[30] Foreign Application Priority Data

Jun. 23, 1993 [DE] Germany ............... 43 20 885.1

[51] Int. Cl.$^6$ ................................ H01L 21/76
[52] U.S. Cl. ................. 437/62; 437/90; 437/67; 437/160; 437/952
[58] Field of Search ............... 437/62, 67, 160, 437/162, 164, 952; 148/DIG. 50, DIG. 85, DIG. 86

[56] References Cited

U.S. PATENT DOCUMENTS

| | | | |
|---|---|---|---|
| 4,063,967 | 12/1977 | Graul et al. | 437/162 |
| 4,274,892 | 6/1981 | Templin | 437/162 |
| 4,333,794 | 6/1982 | Beyer et al. | |
| 4,473,598 | 9/1984 | Ephrath et al. | |
| 4,666,556 | 5/1987 | Fulton et al. | |
| 4,861,729 | 8/1989 | Fuse et al. | |
| 4,977,098 | 12/1990 | Yu et al. | 437/162 |
| 5,116,778 | 5/1992 | Haskell et al. | |
| 5,116,779 | 5/1992 | Iguchi | |
| 5,227,329 | 7/1993 | Kobayashi et al. | |
| 5,371,039 | 12/1994 | Oguro | |
| 5,411,912 | 5/1995 | Sakamoto | |
| 5,416,041 | 5/1995 | Schwalke | |

FOREIGN PATENT DOCUMENTS

| | | |
|---|---|---|
| 0265958 | 5/1988 | European Pat. Off. |
| 0295786 | 12/1988 | European Pat. Off. |
| 0296754 | 12/1988 | European Pat. Off. |
| 0338480 | 10/1989 | European Pat. Off. |
| 0430168 | 6/1991 | European Pat. Off. |
| 0444836 | 9/1991 | European Pat. Off. |
| 0515809A2 | 10/1992 | European Pat. Off. |
| 2254731 | 10/1992 | United Kingdom |
| 85/04760 | 10/1985 | WIPO |
| 86/04454 | 7/1986 | WIPO |

OTHER PUBLICATIONS

Wolf, S., et al, *Silicon Processing for the VLSI Era; vol. 1 Process Technology*, 1986, Lattice Press, p. 215.

K. Fujino et al., "Surface Modification of Base Materials for TEOS/O$_3$ Atmospheric Pressure Chemical Vapor Deposition", 1046 Journal of the Electrochemical Society 139 (1992)Jun., No. 6, Manchester, NH, US, pp. 1690–1692.

A. Nakagawa et al., "500V Lateral Double Gate Bipolar--Mode MOSFET (DGIGBT) Dielectrically Isolated by Silicon Wafer Direct-Bonding(DISDB)", Extended Abstracts of the 20th (1988 international) Conference on Solid State Devices and Materials, Tokyo, 1988, pp. 33–36.

D. Widmann et al., Technologie hochintegrierter Schaltungen, Spriner-Verlag, 1988, pp. 80–83 & pp. 223–225.

IBM Technical Disclosure Bulletin, "Voidless Final Closure Process for Polysilicon Trench", vol. 28, No. 10, Mar. 1986, pp. 4594–4595.

(List continued on next page.)

*Primary Examiner*—George R. Fourson
*Attorney, Agent, or Firm*—Hill, Steadman & Simpson

[57] ABSTRACT

A method for producing an insulating trench in an SOI substrate having integrated logic elements and high-voltage power components is provided. A trench extending down to an insulating layer is etched and covered with a doped silicon structure. Diffusion regions neighboring the trench are produced by drive-out from the doped amorphous silicon structure and an insulation structure is simultaneously produced in the trench by oxidation of the doped silicon structure.

10 Claims, 6 Drawing Sheets

OTHER PUBLICATIONS

S. Nakajima et al., "An Isolation–Merged Vertical Capacitor Cell for Large Capacity Dram", IEDM 1984, pp. 240–243.

IBM Technical Disclosure Bulletin, "Sidewall Channel–Stop Doping for Deep–Trench Isolation of Fet Devices", vol. 27, No. 10A, Mar. 1985, pp. 5501–5504.

Y. Ohata et al., "Dielectrically Isolated Intelligent Power Switch", IEEE 1987 Custom Integrated Circuits Conference, pp. 443–446.

N. Yasuhara et al., "SOI Device Structures Implementing 650 V High Voltage Output Devices on VLSIs", IEDM 91–141, pp. 6.1.2–6.1.4 (1991).

A. Nakagawa et al., "New 500V Output Device Structures for Thin Silicon Layer on Silicon Dioxide Film", Proceeding of 1990 International Symposium of Power Semiconductor Devices & icS tOKYO, pp. 97–101 (1990).

S. Fisher et al., ECS, Ext. Abstr., vol. 99–2 (1992), p. 381.

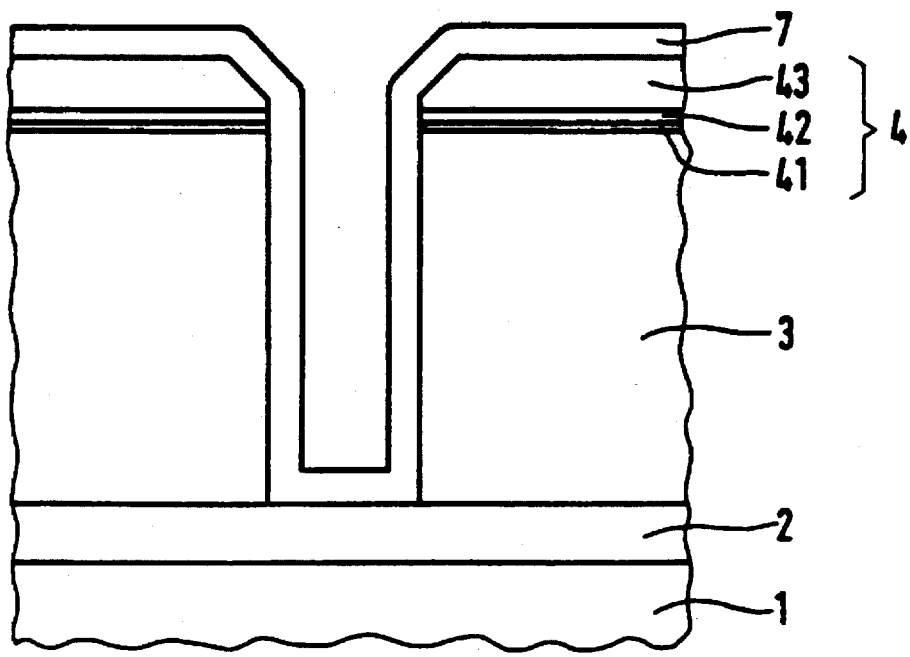
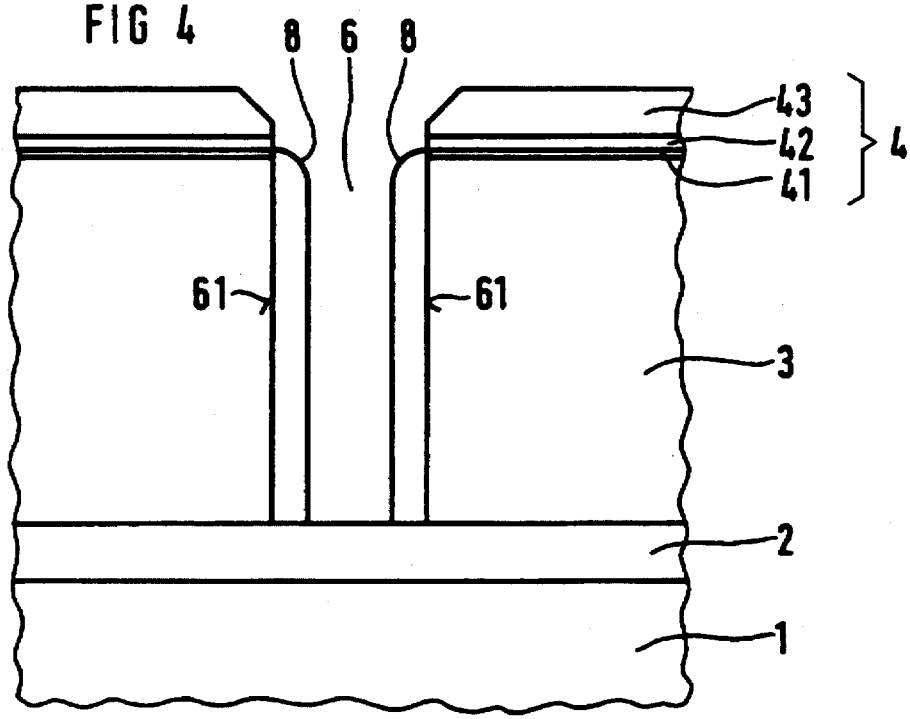

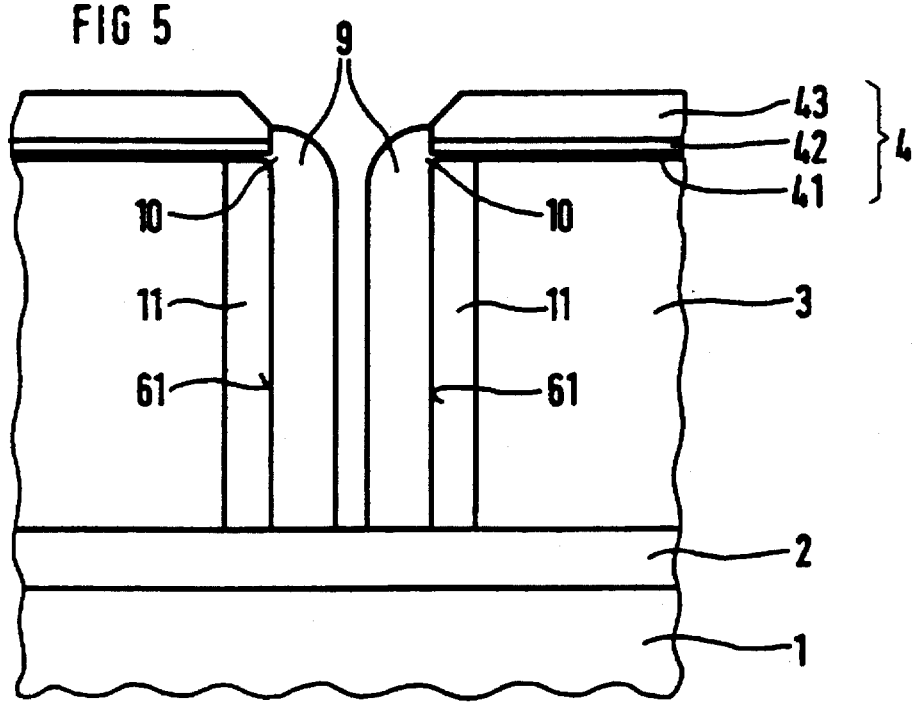
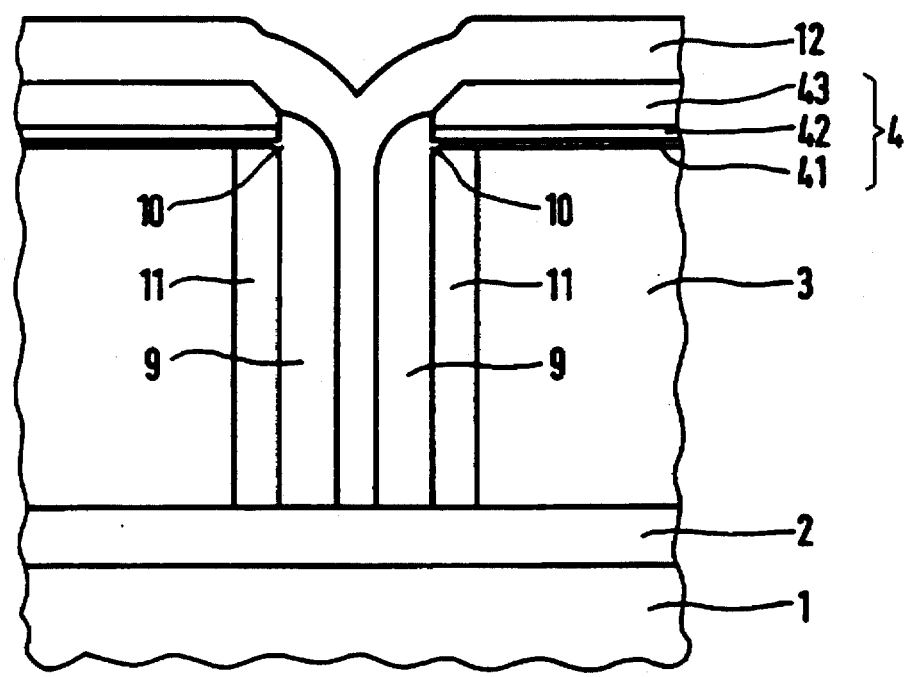

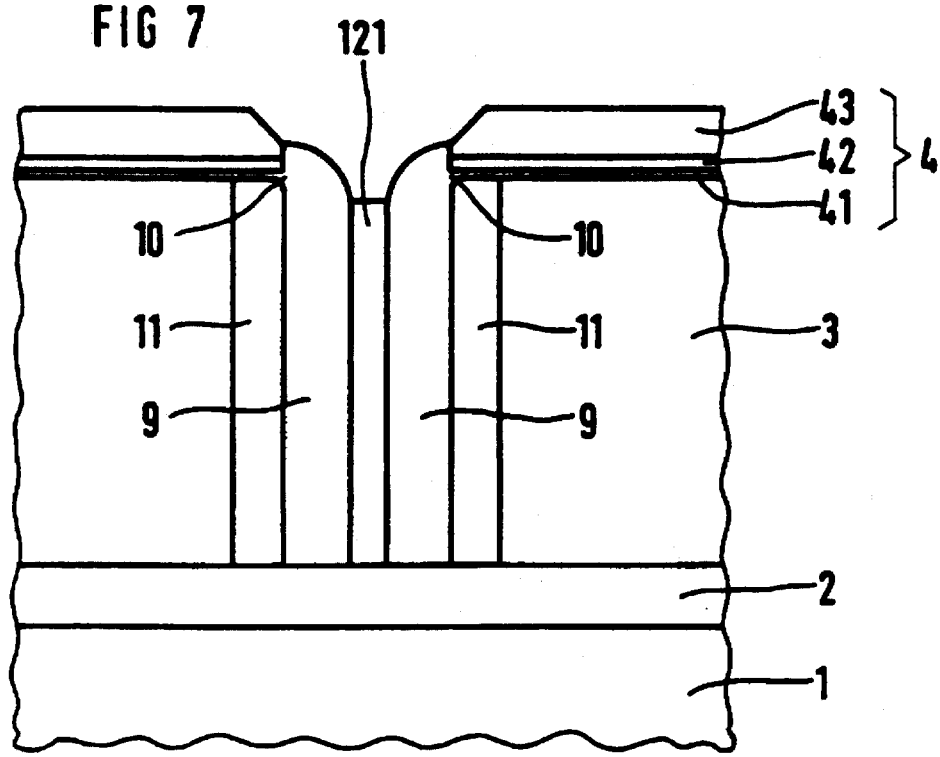
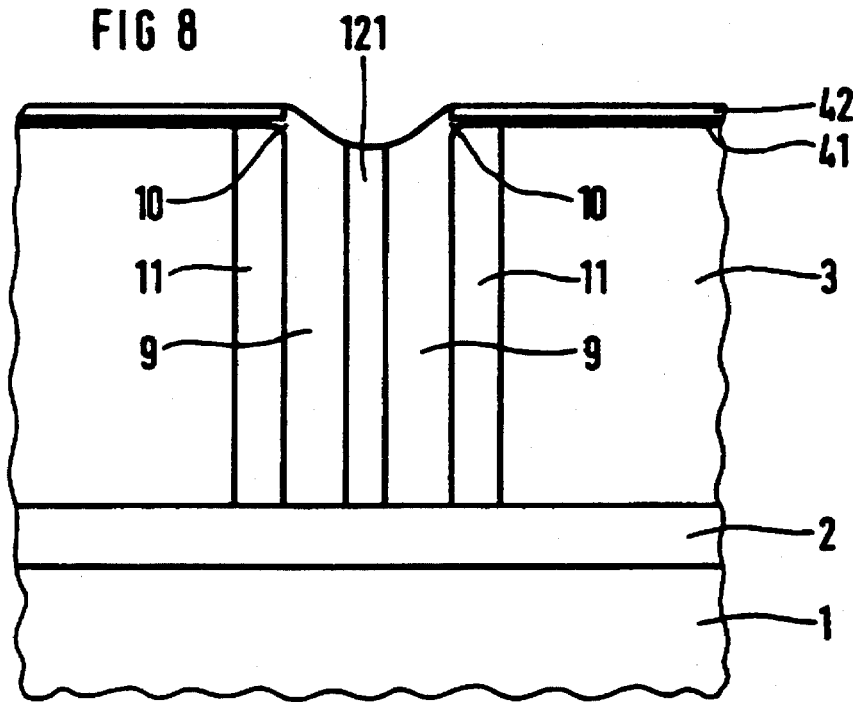

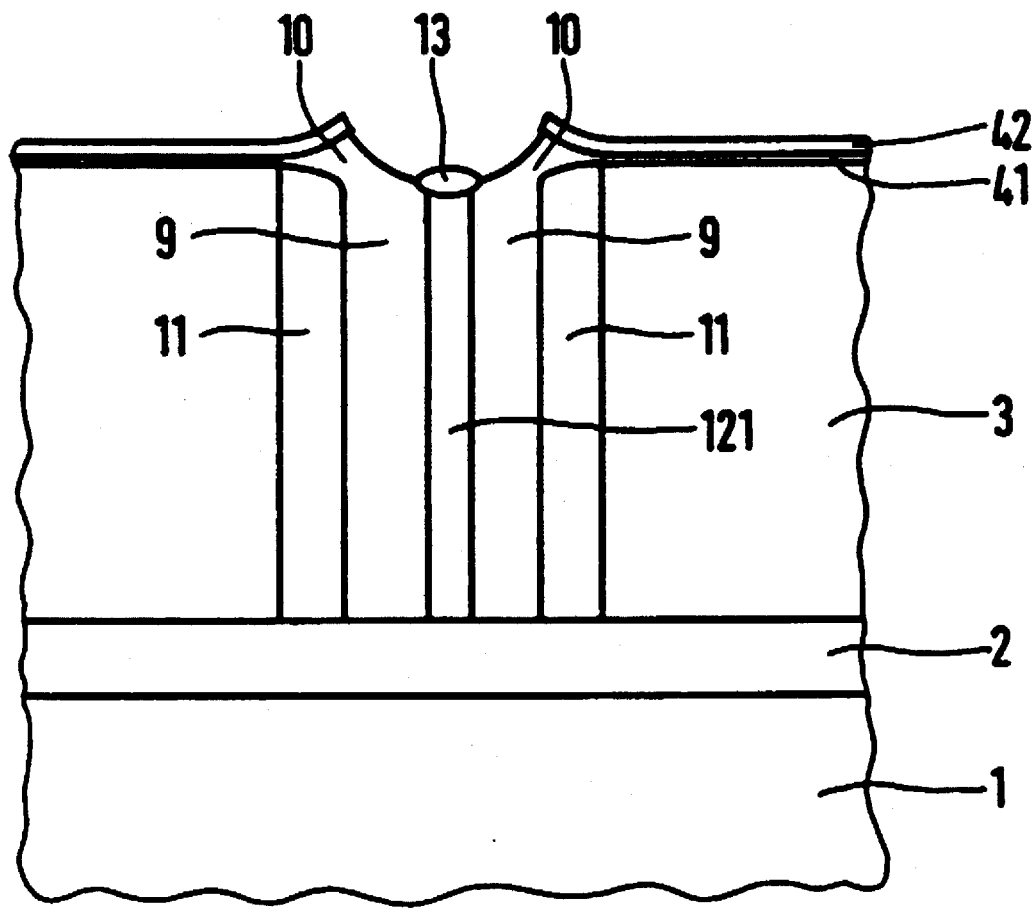

METHOD FOR MANUFACTURING AN INSULATING TRENCH IN AN SOI SUBSTRATE FOR SMARTPOWER TECHNOLOGIES

This is a continuation of application Ser. No. 08/264,141, filed Jun. 21, 1994, now abandoned.

BACKGROUND OF THE INVENTION

1. Field of the Invention

The present invention is directed generally to smart-power technologies and more specifically to a method for manufacturing an insulating trench in a substrate for smart-power technologies.

2. Description of the Related Art

In smart powered technology, complex components are monolithically integrated in a substrate with high-voltage power components. Since the logic components are operated with voltage levels of about 5 volts but voltages up to 500 volts occur with the high-voltage power components, an electrical separation of the high-voltage components from the logic components is required.

It is known (see, for example, Yu Ohata et al, IEEE 1987 CICC, pgs. 443–446 and A. Nakagawa et al, ISPS 1990, pgs. 97–101) to completely electrically insulate the high-voltage and low-voltage components from one another by dielectric insulation. To that end, the components are realized in a SOI substrate. An SOI substrate has an insulating layer of $SiO_2$ on a monocrystalline silicon wafer and also has a monocrystalline layer on the insulating layer. This monocrystalline silicon layer is the surface of the SOI substrate. The insulating layer of the SOI substrate assures the vertical insulation, whereas the lateral insulation of the components is realized by trenches filled with insulating material. For many applications, the voltage behavior of the components is improved in that the sidewalls of the trenches are $n^+$ or $p^+$ doped over the entire depth down to the insulating layer of the SOI material before the trenches are filled with oxide (see N. Yasuhara et at, IEDM 1991 pgs. 141–144).

For manufacturing the lateral insulation, it is known to first implement the doping of the sidewalls after the etching of the trench. For example, this doping occurs by drive-out from doped glasses such as boron silicate glass (BSG) or phosphorous silicate glass (PSG) (for example, see European Patent application 441482-A), by occupation from the vapor phase (see, for example, European Patent application 430168-A) or by ion implantation. Since trench depths of about 20 µm having aspect ratios (i.e., the quotation of trench depth to trench width) of 5–10 occur in smart power technologies, it is problematical to produce a diffusion region with a uniform, prescribable expanse by ion implantation in the doping of the sidewalls. Given doping by drive-out from glasses or occupation from the vapor phase, the layer of doped glass or the occupation layer must be in turn removed after the formation of the diffusion region in order to avoid an uncontrolled drive-out from these layers or a contamination of the equipment in the further course of the process execution. The layers serving as dopant sources must therefore be removed residue-free. There is thereby the risk that the insulating layer of the SOI substrate will be thereby attacked, since no etching stop is present at the bottom of the trench.

The filling of the trench occurs subsequently. Since the trench has a high aspect ratio, it cannot be filled void-free without further due. $SiO_2$ layers which are deposited in chemical vapor deposition (CVD) methods under atmosphere pressure (APCVD) cannot satisfy this requirement because of the inadequate conformity of the layer. When an $SiO_2$ layer is deposited in a low-pressure CVD method (LPCVD), then its conformity is in fact improved, but the deposition rates are too low in order to achieve a filling of the trench in a time acceptable for manufacture.

A. Nakagawa et al. ISPS 1990, pgs. 97–101 discloses that the problem of the CVD deposition can be avoided when the trench is thermally oxidized. An interspace that is filled with polysilicon thereby remains. The polysilicon is re-etched and subsequently oxidized. Another possibility for avoiding the problems of CVD deposition is disclosed by European Patent application 444836-A. The trench is thereby first lined with a thin insulating layer of $SiO_2$ and $Si_3N_4$. Polysilicon is subsequently deposited, re-etched and oxidized.

SUMMARY OF THE INVENTION

The invention provides a method for producing an insulation trench in an SOI substrate having integrated logic components and high-voltage power components. In the method, diffusion regions having a defined expanse can be produced in the sidewalls of the trench, whereby an etch-through of the insulating layer of the SOI substrate is avoided. With the method, the trench can be filled void-free.

This object is inventively resolved by a method for producing an insulation trench in a SOI substrate having integrated logic components and high-voltage power components. The method has the steps of providing the SOI substrate with a monocrystalline silicon wafer, an insulating layer of $SiO_2$ oriented thereon, and a monocrystalline silicon layer oriented on the insulating layer, etching a trench into the monocrystalline silicon layer, the trench extending to the insulating layer, producing a doped silicon structure that at least covers sidewalls of the trench, producing diffusion regions neighboring the trench in the monocrystalline silicon layer by drive-out of dopant from the doped silicon structure and producing an insulation structure in the trench by oxidation of the doped silicon structure. In the method of the invention, the doped silicon structure is used both as diffusion source for producing the diffusion region neighboring the trench, as well as for filling the trench by oxidation of the doped silicon structure. Since the diffusion source—after oxidation to form $SiO_2$—is used as trench fill, the removal of the diffusion source is eliminated, as is the risk of etching free the insulating layer that is connected therewith.

Depending on the demands made of the profile of the diffusion regions, the drive-out of dopant from the doped silicon structure and the oxidation of the doped silicon structure occur in separate steps or in a common step. It is advantageous to implement the drive-out of dopant from the doped silicon structure in an oxidizing atmosphere, since the oxidation of the doped silicon structure then simultaneously results with the drive-out of dopant, and a process step can be eliminated.

It lies within the framework of the invention to deposit a doped silicon layer with essentially conformal edge coverage for forming the doped silicon structure. The doped silicon structure is then produced by structuring the doped silicon layer.

The doped silicon layer is preferably deposited in the trench doped in situ. As a result thereof, a uniform distribution of the dopant is assured in the doped silicon layer. Further, the process is simplified by the doped deposition of the layer in situ.

Alternatively, the doped silicon layer is deposited in the trench as an undoped silicon layer. An occupation layer of doped glass is applied thereon. The silicon layer is doped by drive-out of dopant from the doped glass. Depending on the desired doping, PSG or BSG is suitable as doped glass. The occupation layer is removed by dry-etching and/or wet-etching after the drive-out. Subsequently, the doped silicon structure is produced by structuring the doped silicon layer. The doped silicon layer serves as etching stop in the removal of the occupation layer. In this step, the doped silicon layer protects the surface of the insulating layer of the SOI substrate against an etching attack. A massive over-etching is therefore possible for the residue-free removal of the occupation layer. This embodiment of the invention can be utilized by using conventional process equipment with APCVD methods wherein the deposition of a silicon layer doped in situ is not provided.

The doped silicon layer can be deposited as an amorphous or as a polycrystalline layer. It is advantageous to deposit the doped silicon layer as an amorphous layer, since amorphous silicon exhibits better homogeneity.

A trench mask of $SiO_2$, at least at its surface, is preferably used for etching the trench. The etching of the trench then occurs selectively relative to $SiO_2$. The insulating layer of the SOI substrate then represents an etching stop since this is likewise composed of $SiO_2$.

It is advantageous to anisotropically re-etch the doped silicon layer selectively relative to $SiO_2$ before the drive-out, so that horizontal surfaces of the trench mask and of the insulating layer of the SOI substrate are uncovered. Self-aligned, doped silicon spacers that form the doped silicon structure remain at vertical sidewalls of the monocrystalline silicon layer and of the trench mask. The diffusion regions are produced by drive-out from the silicon spacers. Since the parts of the doped silicon layer on horizontal surfaces of the substrate are removed, a planar structure is thus produced in a simple way.

According to a further embodiment, the doped silicon structure is deposited by doped, selective epitaxy at the sidewalls of the monocrystalline silicon layer of the SOI substrate that are uncovered in the trench. Silicon grows on silicon surfaces in the selective epitaxy. No silicon thereby grows on the uncovered surfaces of the trench mask and of the insulating layer. In this case, a structuring step, for example, anisotropic etching, is not required for the formation of the silicon structure, which leads to a simplification of the process.

For the complete filling of the trench, finally, it lies within the framework of the invention to deposit a further silicon layer that fills the clearance within the insulation structure in the trench and at whose surface a $SiO_2$ covering is formed self-aligned by oxidation.

According to another embodiment, the clearance within the insulation structure in the trench is filled by deposition of $SiO_2$ in an $O_3$-TEOS CVD method as known from S. Fischer et al., ECS, Ext. Abstr., Vol. 92-2, p. 381 (1992).

The invention shall be set forth in greater detail below with reference to the figures and to exemplary embodiments.

BRIEF DESCRIPTION OF THE DRAWINGS

FIG. 3 illustrates the SOI substrate after the deposition of the doped silicon layer of the present invention.

FIG. 4 illustrates the SOI substrate after re-etching of the doped silicon layer of the present invention.

FIG. 5 illustrates the SOI substrate after drive-out from and oxidation of the doped silicon layer of the present invention.

FIG. 6 illustrates the SOI substrate after the filling of the remaining clearance in the trench with a further silicon layer of the present invention.

FIG. 7 illustrates the SOI substrate after re-etching of the further silicon layer of the present invention.

FIG. 8 illustrates the SOI substrate after removal of the upper layer of the trench mask of the present invention.

FIGS. 9 illustrates the SOI substrate after formation of a $SiO_2$ covering in the upper region of the trench of the present invention.

DETAILED DESCRIPTION OF THE PREFERRED EMBODIMENTS

Figure 1:
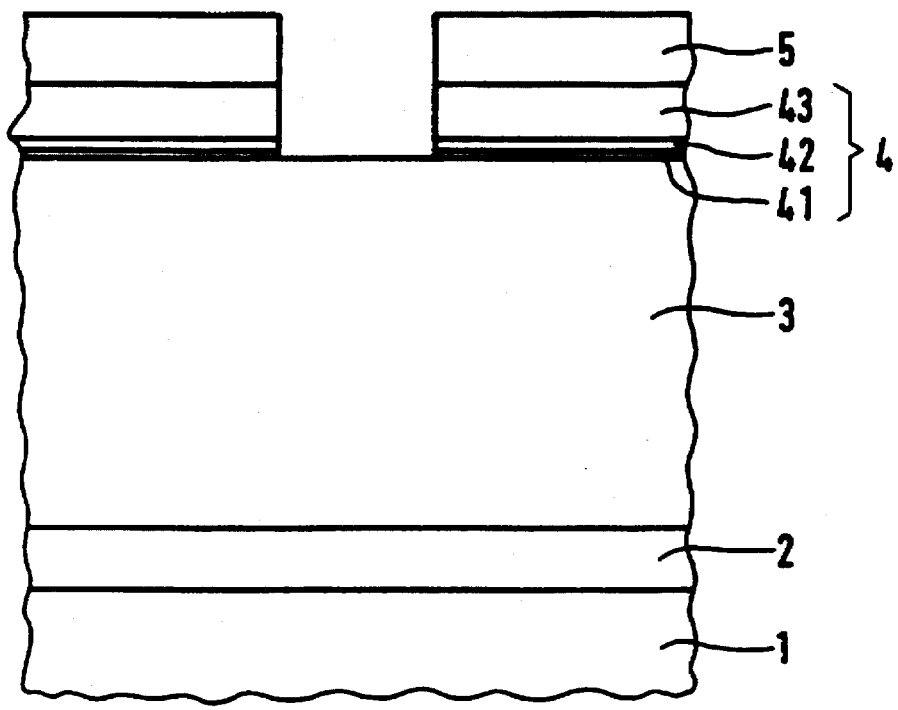
FIG. 1 illustrates an SOI substrate with a trench mask of the present invention.

An SOI substrate comprises a monocrystalline silicon wafer 1 that, for example, is $p^+$-doped, with an insulating layer 2 of $SiO_2$ oriented thereon and has a monocrystalline silicon layer 3 oriented on the insulating layer 2 (see FIG. 1). The SOI substrate is preferably manufactured according to the direct wafer bonding (DWB) or silicon direct bonding (SDB) method that, for example, is known from Yu Ohata et at., EEEE 1987, pgs. 443–446. The thickness of the insulating layer 2, for example, is 2 µm. The thickness of the monocrystalline silicon layer 3 is, for example, 20 µm. The monocrystalline silicon layer 3, for example, is lightly n-doped. The dopant concentration in the monocrystalline silicon layer 3 is, for example, $10^{14}$ phosphorous atoms/$cm^3$. The components are produced later in the monocrystalline silicon layer 3.

A trench mask 4 is applied onto the surface of the monocrystalline silicon layer 3. The trench mask 4 has a lower layer 41, a middle layer 42 and an upper layer 43. For example, the lower layer 41 is produced by thermal oxidation with a thickness of 50 nm. The middle layer 42, for example, is produced with a thickness of 150 nm by CVD deposition of $Si_3N_4$. The upper layer 43 is produced with a thickness of 1600 nm, for example by CVD deposition of $SiO_2$. For structuring the trench mask 4, a lacquer mask 5 is applied onto this layer sequence. The trench mask 4 is structured in a $CHF_3/O_2$ dry etching process using the lacquer mask 5. The trench mask must be suitable for etching a deep trench.

Figure 2:
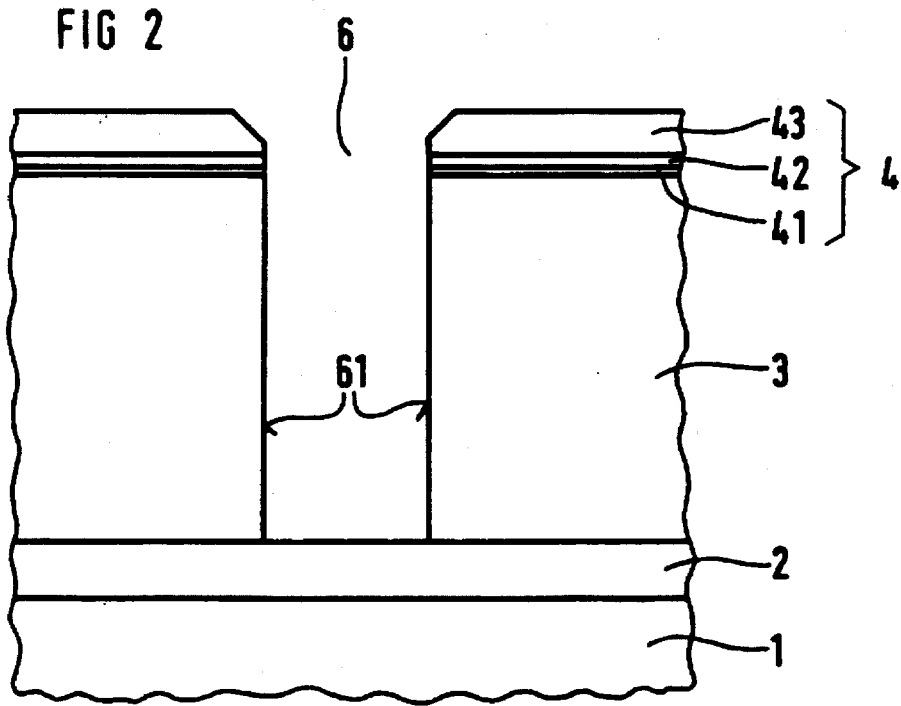
FIG. 2 illustrates the SOI substrate after the trench etching of the present invention.

After removal of the lacquer mask 5 by lacquer stripping, a trench 6 is etched into the monocrystalline silicon layer 3 with the assistance of the trench mask 4 (see FIG. 2). For example, the etching occurs anisotropically in a dry etching process with a $Cl_2/O_2$ chemistry. The etching occurs selectively relative to $SiO_2$. The etching therefore stops as soon as the surface of the insulating layer 2 is uncovered.

For the formation of clean sidewalls 61 of the trench 6, etching products located at the sidewalls are removed in a HF dip.

In an embodiment, a doped silicon layer 7 is deposited onto the surface of the trench mask 4, onto the side walls 61 of the trench and onto the uncovered surface of the insulating layer 2 (see FIG. 3). The doped silicon layer 7 is doped in situ. The doped silicon layer 7 is for example, amorphous silicon and has a dopant concentration of, for example, $4 \times 10^{20}$ $cm^{-3}$ boron. The doped silicon layer 7 is deposited at 400°–500° C. The dopant is thereby embedded in amorphous silicon; however, it is not yet activated. The doped silicon layer 7 is deposited with essentially conformal edge coverage. This means that the layer thickness of the doped silicon layer 7 is essentially the same at horizontal and at vertical supports. The thickness of the doped silicon layer 7 is matched to the width and to the geometry of the trench 6. Given a width of the trench 6 of, for example, 2 µm, the doped silicon layer 7 is deposited, for example, with a thickness of 400 nm.

Alternatively to the deposition of the doped silicon layer 7 that is doped in situ, this can be produced by deposition of an undoped silicon layer onto which an occupation layer of doped glass is applied. Depending on the desired doping, the occupation layer is produced from BSG or PSG on the basis of atmospheric CVD deposition (APCVD). The dopant content in the occupation layer is 1–8 weight percent, preferably 4–6 weight percent. In a temperature step at, for example, 1000° C. in a nitrogen atmosphere over 20 minutes, the dopant is driven out of the occupation layer, so that a doped silicon layer 7 is formed from the undoped silicon layer. Potential fluctuations in thickness of the occupation layer thereby do not lead to non-uniformities of the doping in the doped silicon layer 7, since a uniform dopant concentration is set in the doped silicon layer 7 by the diffusion in silicon. After the drive-out, the occupation layer is removed selectively relative to the doped silicon layer 7 on the basis of dry and/or wet etching.

The doped silicon layer 7 is etched in an anisotropic dry etching process, for example in a HBr/Cl$_2$ plasma, until horizontal surfaces of the trench mask 4 and of the insulating layer 2 are uncovered (see FIG. 4). Spacers 8 of doped silicon thereby result at the sidewalls 61 of the trench 6.

Alternatively to the method set forth with reference to FIG. 3 and FIG. 4, the spacers 8 of doped silicon can also be deposited by selective epitaxy. In the selective epitaxy, silicon only grows on uncovered silicon surfaces. Since the horizontal surface of the trench mask 4 and of the insulating layer 2 is SiO$_2$ and the surface of the monocrystalline silicon layer 3 is uncovered only at the sidewalls 61 of the trench 6, the spacers 8 in the selective epitaxy only grow on the sidewalls 61 of the trench 6. For example, selective epitaxy is implemented by using a mixture of Cl$_2$ and SiH$_4$. B$_2$H$_6$ diluted in N$_2$ is thereby added to the process gas as doping gas in order to dope the spacers 8 in situ with, for example, $4 \times 10^{20}$ cm$^{-3}$ boron. When the spacers 8 are to be n-doped, AsH$_3$ diluted in N$_2$ is suitable as doping gas. The selective epitaxy is implemented, for example, in the temperature range between 800° C. and 900° C. and with a pressure from 500 mTorr–100 Torr.

Due to a temperature treatment at 1000° C. in a humid atmosphere, dopant diffuses from the spacers 8 into the monocrystalline silicon layer 3 and, neighboring the trench 6, forms diffusion regions 11 therein (see FIG. 5). Simultaneously, the amorphous silicon of the spacers 8 partly recrystallizes. An insulation structure 9 as well as an SiO$_2$ bird's beak 10 at the upper edge of the monocrystalline silicon layer 3 thereby form. The temperature treatment is continued at least until the oxide thickness required for insulation is achieved. The SiO$_2$ bird's beak 10 forms by oxidation of silicon of the monocrystalline silicon layer 3. The insulation structure 9 is formed by oxidation of silicon of the spacers 8. The dopant concentration in the diffusion region 11 is set dependent on the doping of the spacers 8.

By depositing a further silicon layer 12, a clearance that remains in the trench 7 is filled (see FIG. 6). The further silicon layer 12 is, for example, amorphous silicon (see FIG. 6).

By re-etching, for example by dry etching in a HBr/Cl$_2$ plasma, the surface of the upper layer 43 of the trench mask 4 is uncovered. Amorphous silicon of the further silicon layer 12 remaining in the clearance of the trench 6 thereby forms a silicon fill 121 (see FIG. 7). The etching is continued until the upper edge of the silicon fill 121 terminates under the lower layer 41 of thermal SiO$_2$ of the trench mask 4.

Subsequently, the upper layer 43 of the trench mask is removed by etching with, for example, CHF$_3$/O$_2$ (see FIG. 8). The etching occurs selectively relative to Si$_3$N$_4$, so that it stops at the surface of the middle layer 42 of the trench mask 4. In this etching, the insulation structure 9, which is likewise SiO$_2$, is etched back in the upper region, so that the insulation structure 9 subsequently terminates in height approximately at the middle layer 42 of the trench mask 4.

In a temperature step at 1000° C. in a humid atmosphere, the surface of the silicon fill 121 is oxidized. An insulation termination 13 that completely covers the silicon fill 121 thereby results. The insulation termination 13 results without using a mask technique, i.e. self-aligned. Simultaneously with the formation of the insulation termination 13, the SiO$_2$ bird's beak 10 continues to form at the upper edge of the monocrystalline silicon layer 13. By rounding the edges, it contributes to raising the breakdown voltage.

The clearance (see FIG. 5) remaining within the insulation structure 9 can, as an alternative to the method described with reference to FIGS. 6–9, be filled by conformal deposition of SiO$_2$, for example in a O$_3$/TEOS method. To that end, a CVD method is implemented wherein a process gas containing O$_3$ and Si(OC$_2$H$_5$)$_4$ is used. For example, the CVD method is implemented at a pressure in the range from 50–600 Torr and at a temperature in the range from 200°–600° C. The O$_3$ part in the process gas amounts to 0.5–6 weight percent. In this method, a clearance remaining in the trench is completely filled with SiO$_2$. Subsequently, the logic components and the high-voltage components are produced in the monocrystalline silicon layer 3.

Figure 10:
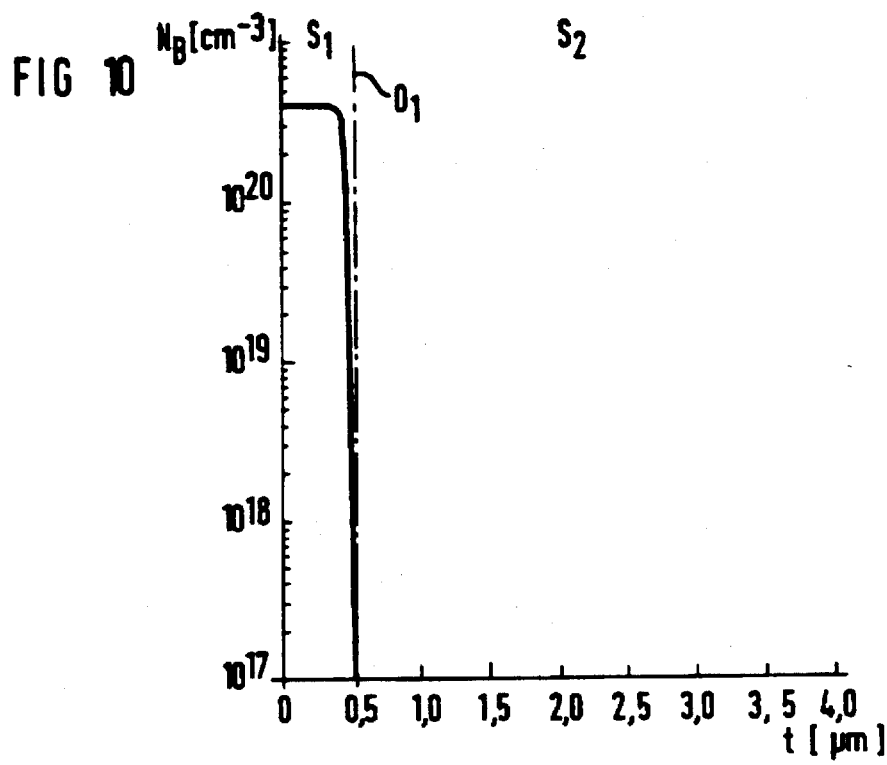
FIG. 10 and FIG. 11 illustrate dopant distributions determined by simulation calculations before and after the drive-out of dopant and oxidation of the doped silicon layer of the present invention.

FIG. 10 shows the boron distribution of a boron-doped silicon layer arranged on a substrate. The broken line O$_1$ indicates the surface of the silicon substrate. The silicon substrate is doped with $10^{15}$ phosphorous atoms per cm$^3$. The boron-doped silicon layer has a thickness of 500 nm and is doped with $4 \times 10^{20}$ cm$^{-3}$ boron. In FIG. 10, the region corresponding to the doped silicon layer is referenced S$_1$ and the region corresponding to the substrate is referenced S$_2$. The boron dopant concentration exhibits a steep drop in the region of the surface O$_1$ of the substrate S$_2$.

Figure 11:
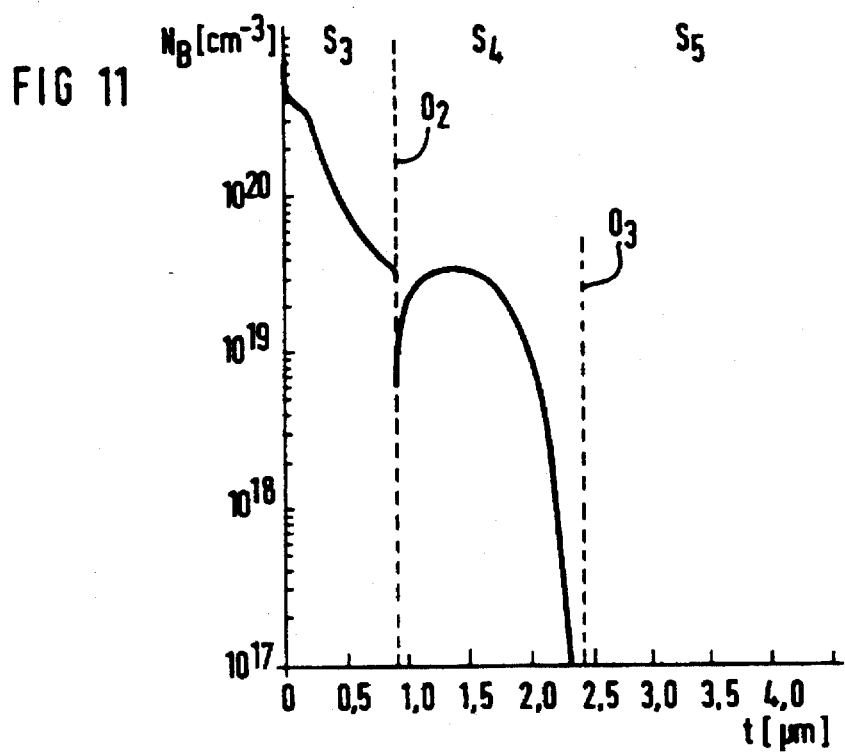

FIG. 11 shows the boron distribution after the drive-out and oxidation of the doped silicon layer in a humid atmosphere at 1000° C. The doped silicon layer becomes a SiO$_2$ layer due to oxidation, this corresponding to the region referenced S$_3$ in FIG. 11. A p-doped diffusion region arises in the surface of the substrate due to drive-out. The region referenced S$_4$ in FIG. 11 corresponds to the diffusion region. The initial doping of the substrate prevails in the region S$_5$ in FIG. 11. The broken line referenced O$_2$ in FIG. 11 corresponds to the surface of the substrate. The broken line referenced O$_3$ in FIG. 11 corresponds to the limitation of the diffusion region. FIG. 10 and FIG. 11 are the result of simulation calculations with which it was verified that both a complete oxidation of an amorphous silicon layer as well as the drive-out and formation of the diffusion region are possible simultaneously at 1000° C. in a humid atmosphere.

Since a doping of the sidewalls of the trench and a filling of the trench simultaneously occur in the method of the invention, a simplified process management results.

Another advantage of the method of the invention is that the process steps for doping the sidewall of the trench and for filling the trench are conventional process steps from CMOS technology. Since such CMOS processes are already required for the manufacture of the logic components this means that only steps compatible with CMOS processes are used.

Improved electrical properties are achieved due to the self-aligned insulation termination at the surface of the trench given simultaneous rounding of the edges and formation of an enlarged $SiO_2$ bird's beak.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

I claim:

1. Method for producing an insulation trench in a SOI substrate having integrated logic components and high-voltage power components, said method comprising the steps of:

provding an SOI substrate with a monocrystalline silicon wafer, an insulating layer of $SiO_2$ oriented thereon, and a monocrystalline silicon layer oriented on said insulating layer;

producing a trench mask on a surface of said silicon layer, said trench mask comprising $SiO_2$ at least at said surface of said silicon layer, and etching, by selective etching relative to $SiO_2$, a trench in said silicon layer extending to said insulating layer using said trench mask;

producing a doped silicon structure from amorphous silicon that at least covers sidewalls of said trench;

depositing said doped silicon structure by selective silicon deposition at perpendicular sidewalls of said monocrystalline layer that form said sidewalls of said trench;

producing diffusion regions neighboring said trench in said monocrystalline silicon layer by drive-out of dopant from said doped silicon structure in an oxidizing atmosphere; and producing an insulation structure in said trench by oxidation of said doped silicon structure so that said oxidation of said doped silicon structure so that said oxidation of said doped silicon structure occurs simultaneously with said drive-out of dopant.

2. Method according to claim 1, wherein said step of producing a doped silicon structure from amorphous silicon that at least covers sidewalls of said trench is further defined by depositing an amorphous doped silicon layer.

3. Method according to claim 1, wherein said step of producing diffusion regions by drive-out of dopant from said doped silicon structure in an oxidizing atmosphere is further defined by performing said drive-out of dopant from said doped silicon structure and oxidation in a humid atmosphere having a temperature range between 900° C. and 1200° C.

4. Method according to claim 2, wherein said step of depositing said amorphous doped silicon layer is further defined by depositing said amorphous doped silicon layer at 400° C.–550° C. using $SiH_4$.

5. Method according to claim 2, wherein said step of depositing said amorphous doped silicon layer is further defined by depositing said amorphous doped silicon layer at 400° C.–550° C. using $Si_2H_6$.

6. Method according to claim 1, wherein a clearance is formed in said trench in said insulation structure, said method further comprising the step of:

filling said clearance remaining within said insulation structure in said trench with a silicon fill by deposition and re-etching of a further silicon layer.

7. Method according to claim 6, further comprising the steps of:

forming said trench mask as a layer sequence having a lower layer of thermal $SiO_2$, a middle layer of CVD $Si_3N_4$, and an upper layer of CVD $SiO_2$;

providing said re-etching of said further silicon layer such that said silicon fill terminates under said lower layer of said trench mask;

selectively etching relative to $Si_3N_4$ to remove said upper layer of said trench mask to etch back said insulation structure in said upper region so that said insulation structure essentially terminates with said middle layer of said trench mask; and oxidizing said surface of said silicon fill to produce an insulation termination that completely covers said silicon fill.

8. Method according to claim 7, wherein said step of oxidizing said surface of said silicon fill to produce an insulation termination that completely covers said silicon fill is further defined by conducting said oxidizing to form said insulation termination in a humid atmosphere having a temperature range between 900° C. and 1200° C.

9. Method according to claim 1, wherein a clearance is formed in said trench in said insulation structure, said method further comprising the step of:

filling said clearance remaining within said insulation structure in said trench with $SiO_2$ in a CVD method using a process gas containing $O_3$ and $Si(OC_2H_5)_4$.

10. Method according to claim 1, wherein said step of depositing said doped silicon structure by selective silicon deposition at perpendicular sidewalls of said monocrystalline silicon layer that form said sidewalls of said trench is further defined by implementing selective epitaxy using $Cl_2/SiH_4$.

* * * * *